US008138027B2

(12) United States Patent
Camacho et al.

(10) Patent No.: US 8,138,027 B2
(45) Date of Patent: Mar. 20, 2012

(54) OPTICAL SEMICONDUCTOR DEVICE HAVING PRE-MOLDED LEADFRAME WITH WINDOW AND METHOD THEREFOR

(75) Inventors: Zigmund R. Camacho, Singapore (SG); Henry D. Bathan, Singapore (SG); Lionel Chien Hui Tay, Singapore (SG); Arnel Senosa Trasporto, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 379 days.

(21) Appl. No.: 12/044,688

(22) Filed: Mar. 7, 2008

(65) Prior Publication Data

US 2009/0224386 A1 Sep. 10, 2009

(51) Int. Cl.
*H01L 21/00* (2006.01)

(52) U.S. Cl. ........ 438/127; 438/111; 438/112; 438/113; 438/115; 438/116; 257/E23.141; 257/E23.18; 257/E21.502; 257/E23.045; 257/E33.066

(58) Field of Classification Search .................... 438/127
See application file for complete search history.

(56) References Cited

U.S. PATENT DOCUMENTS

| | | | | | |
|---|---|---|---|---|---|
| 4,190,855 | A | * | 2/1980 | Inoue | 257/668 |
| 4,760,440 | A | * | 7/1988 | Bigler et al. | 257/680 |
| 5,122,861 | A | * | 6/1992 | Tamura et al. | 257/434 |
| 5,149,958 | A | * | 9/1992 | Hallenbeck et al. | 250/216 |
| 5,432,358 | A | * | 7/1995 | Nelson et al. | 257/81 |
| 5,521,992 | A | * | 5/1996 | Chun et al. | 385/14 |
| 5,576,869 | A | * | 11/1996 | Yoshida | 349/149 |
| 5,614,442 | A | * | 3/1997 | Tserng | 438/122 |
| 5,699,073 | A | * | 12/1997 | Lebby et al. | 345/82 |
| 5,739,800 | A | * | 4/1998 | Lebby et al. | 345/82 |
| 5,786,589 | A | * | 7/1998 | Segawa et al. | 250/208.1 |
| 5,789,806 | A | * | 8/1998 | Chua et al. | 257/676 |
| 5,818,404 | A | * | 10/1998 | Lebby et al. | 345/82 |
| 6,100,103 | A | * | 8/2000 | Shim et al. | 438/26 |
| 6,106,161 | A | * | 8/2000 | Basavanhally et al. | 385/88 |
| 6,137,158 | A | * | 10/2000 | Cohen et al. | 257/666 |
| 6,144,507 | A | * | 11/2000 | Hashimoto | 359/819 |
| 6,147,389 | A | * | 11/2000 | Stern et al. | 257/434 |
| 6,201,285 | B1 | * | 3/2001 | Iwata et al. | 257/419 |
| 6,342,406 | B1 | * | 1/2002 | Glenn et al. | 438/57 |

(Continued)

FOREIGN PATENT DOCUMENTS

JP 09045726 * 2/1997

*Primary Examiner* — N Drew Richards
*Assistant Examiner* — Ankush Singal
(74) *Attorney, Agent, or Firm* — Robert D. Atkins; Patent Law Group: Atkins & Associates, P.C.

(57) ABSTRACT

A semiconductor device is made by providing a semiconductor die having an optically active area, providing a leadframe or pre-molded laminated substrate having a plurality of contact pads and a light transmitting material disposed between the contact pads, attaching the semiconductor die to the leadframe so that the optically active area is aligned with the light transmitting material to provide a light transmission path to the optically active area, and disposing an underfill material between the semiconductor die and leadframe. The light transmitting material includes an elevated area to prevent the underfill material from blocking the light transmission path. The elevated area includes a dam surrounding the light transmission path, an adhesive ring, or the light transmission path itself can be the elevated area. An adhesive ring can be disposed on the dam. A filler material can be disposed between the light transmitting material and contact pads.

31 Claims, 19 Drawing Sheets

U.S. PATENT DOCUMENTS

| | | | |
|---|---|---|---|
| 6,396,116 B1 * | 5/2002 | Kelly et al. | 257/432 |
| 6,407,381 B1 * | 6/2002 | Glenn et al. | 250/239 |
| 6,492,699 B1 | 12/2002 | Glenn et al. | |
| 6,545,332 B2 * | 4/2003 | Huang | 257/433 |
| 6,566,745 B1 | 5/2003 | Beyne et al. | |
| 6,571,466 B1 * | 6/2003 | Glenn et al. | 29/841 |
| 6,577,012 B1 * | 6/2003 | Greenwood et al. | 257/766 |
| 6,586,829 B1 * | 7/2003 | Yaniv et al. | 257/693 |
| 6,603,183 B1 * | 8/2003 | Hoffman | 257/434 |
| 6,603,915 B2 * | 8/2003 | Glebov et al. | 385/129 |
| 6,621,616 B1 * | 9/2003 | Bauer et al. | 359/273 |
| 6,661,087 B2 * | 12/2003 | Wu | 257/692 |
| 6,674,159 B1 * | 1/2004 | Peterson et al. | 257/680 |
| 6,707,148 B1 * | 3/2004 | Mostafazedeh et al. | 257/704 |
| 6,765,236 B2 | 7/2004 | Sakurai | |
| 6,885,107 B2 | 4/2005 | Kinsman | |
| 6,892,449 B1 * | 5/2005 | Brophy et al. | 29/827 |
| 7,005,719 B2 * | 2/2006 | Masumoto | 257/432 |
| 7,012,315 B1 * | 3/2006 | Campbell | 257/433 |
| 7,042,106 B2 * | 5/2006 | Lu et al. | 257/789 |
| 7,049,166 B2 * | 5/2006 | Salatino et al. | 438/64 |
| 7,084,474 B2 * | 8/2006 | Hung et al. | 257/434 |
| 7,169,641 B2 * | 1/2007 | Shim et al. | 438/108 |
| 7,253,390 B2 * | 8/2007 | Farnworth et al. | 250/208.1 |
| 7,289,089 B2 * | 10/2007 | Iwafuchi | 345/82 |
| 7,302,125 B2 * | 11/2007 | Gobara et al. | 385/14 |
| 7,372,120 B1 * | 5/2008 | George et al. | 257/432 |
| 7,418,163 B2 * | 8/2008 | Chakravorty et al. | 385/14 |
| 7,495,325 B2 * | 2/2009 | Abela | 257/680 |
| 7,593,236 B2 * | 9/2009 | Chikugawa | 361/760 |
| 7,632,713 B2 * | 12/2009 | Farnworth et al. | 438/116 |
| 7,638,813 B2 * | 12/2009 | Kinsman | 257/99 |
| 7,666,711 B2 * | 2/2010 | Pagaila et al. | 438/114 |
| 7,705,465 B2 * | 4/2010 | Kimura et al. | 257/774 |
| 7,723,146 B2 * | 5/2010 | Chow et al. | 438/64 |
| 7,732,915 B2 * | 6/2010 | Dangelmaier et al. | 257/704 |
| 7,736,930 B2 * | 6/2010 | Abela | 438/51 |
| 2001/0000316 A1 * | 4/2001 | Kawai | 385/33 |
| 2001/0022401 A1 * | 9/2001 | Nakamura | 257/778 |
| 2002/0081780 A1 * | 6/2002 | Salatino et al. | 438/127 |
| 2002/0088632 A1 * | 7/2002 | Salatino et al. | 174/52.1 |
| 2002/0089025 A1 * | 7/2002 | Chou | 257/433 |
| 2002/0154239 A1 * | 10/2002 | Fujimoto et al. | 348/340 |
| 2002/0179992 A1 * | 12/2002 | Parsons | 257/467 |
| 2004/0012698 A1 * | 1/2004 | Suda et al. | 348/315 |
| 2005/0006732 A1 * | 1/2005 | Perillat | 257/666 |
| 2005/0104186 A1 * | 5/2005 | Yang et al. | 257/688 |
| 2005/0236685 A1 * | 10/2005 | Minamio | 257/433 |
| 2005/0258518 A1 * | 11/2005 | Yang et al. | 257/666 |
| 2005/0285265 A1 * | 12/2005 | Campbell | 257/730 |
| 2006/0011809 A1 * | 1/2006 | Farnworth et al. | 250/208.1 |
| 2006/0024856 A1 * | 2/2006 | Derderian et al. | 438/57 |
| 2006/0087018 A1 * | 4/2006 | Chao et al. | 257/680 |
| 2006/0211173 A1 * | 9/2006 | Hsiao et al. | 438/116 |
| 2006/0266938 A1 * | 11/2006 | Abela | 250/239 |
| 2007/0034995 A1 * | 2/2007 | Kameyama et al. | 257/666 |
| 2007/0108561 A1 * | 5/2007 | Webster et al. | 257/666 |
| 2008/0001164 A1 * | 1/2008 | Chen et al. | 257/99 |
| 2008/0081457 A1 * | 4/2008 | Lin et al. | 438/614 |
| 2008/0096321 A1 * | 4/2008 | Lin et al. | 438/113 |
| 2008/0213545 A1 * | 9/2008 | Allam et al. | 428/192 |
| 2009/0014822 A1 * | 1/2009 | Poo et al. | 257/432 |

* cited by examiner

US 8,138,027 B2

OPTICAL SEMICONDUCTOR DEVICE HAVING PRE-MOLDED LEADFRAME WITH WINDOW AND METHOD THEREFOR

FIELD OF THE INVENTION

The present invention relates in general to semiconductor devices and, more particularly, to an optical semiconductor device and method of pre-molding a leadframe with a window.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

Some semiconductor devices have optically active regions. The optical devices react to light and generate electrical signals in response thereto. The electrical signals are processed by other active and passive circuits within the semiconductor device. The light must pass through the semiconductor package to reach the optical devices. In some devices, the light passes through an opening in the substrate, such as described in U.S. Pat. No. 6,765,236. The process of forming the opening in the substrate and confirming alignment for the passage of light to the optical devices adds manufacturing steps and complexity. In addition, the semiconductor package typically has underfill material and molding compound for structural integrity and environmental protection. Care must be taken when applying the underfill material and molding compound to avoid blocking the passage of light to the optical devices.

A need exists for a simple process to make optical semiconductor packages without interfering with the passage of light to the optical devices.

SUMMARY OF THE INVENTION

In one embodiment, the present invention is a method of making a semiconductor device comprising the steps of providing a semiconductor die having an optically active area, providing a leadframe having a plurality of contact pads and a light transmitting material disposed between the contact pads, attaching the semiconductor die to the leadframe so that the optically active area is aligned with the light transmitting material to provide a light transmission path to the optically active area, and disposing an underfill material between the semiconductor die and leadframe. The light transmitting material includes an elevated area to prevent the underfill material from blocking the light transmission path.

In another embodiment, the present invention is a method of making a semiconductor device comprising the steps of providing an optical semiconductor die, providing a leadframe having a plurality of contact pads and a light transmitting window disposed between the contact pads, and attaching the optical semiconductor die to the leadframe so that the light transmitting window is aligned to an optically active area of the optical semiconductor die.

In another embodiment, the present invention is a method of making a semiconductor package comprising the steps of providing an optical semiconductor die, providing a substrate having a plurality of contact pads and a light transmitting material disposed between the contact pads, and attaching the optical semiconductor die to the substrate so that the light transmitting material is aligned to the optical semiconductor die.

In another embodiment, the present invention is a semiconductor package comprising an optical semiconductor die, and a substrate having a plurality of contact pads and a light transmitting material disposed between the contact pads. The optical semiconductor die is attached to the substrate so that the light transmitting material is aligned to an optically active area of the optical semiconductor die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1A:
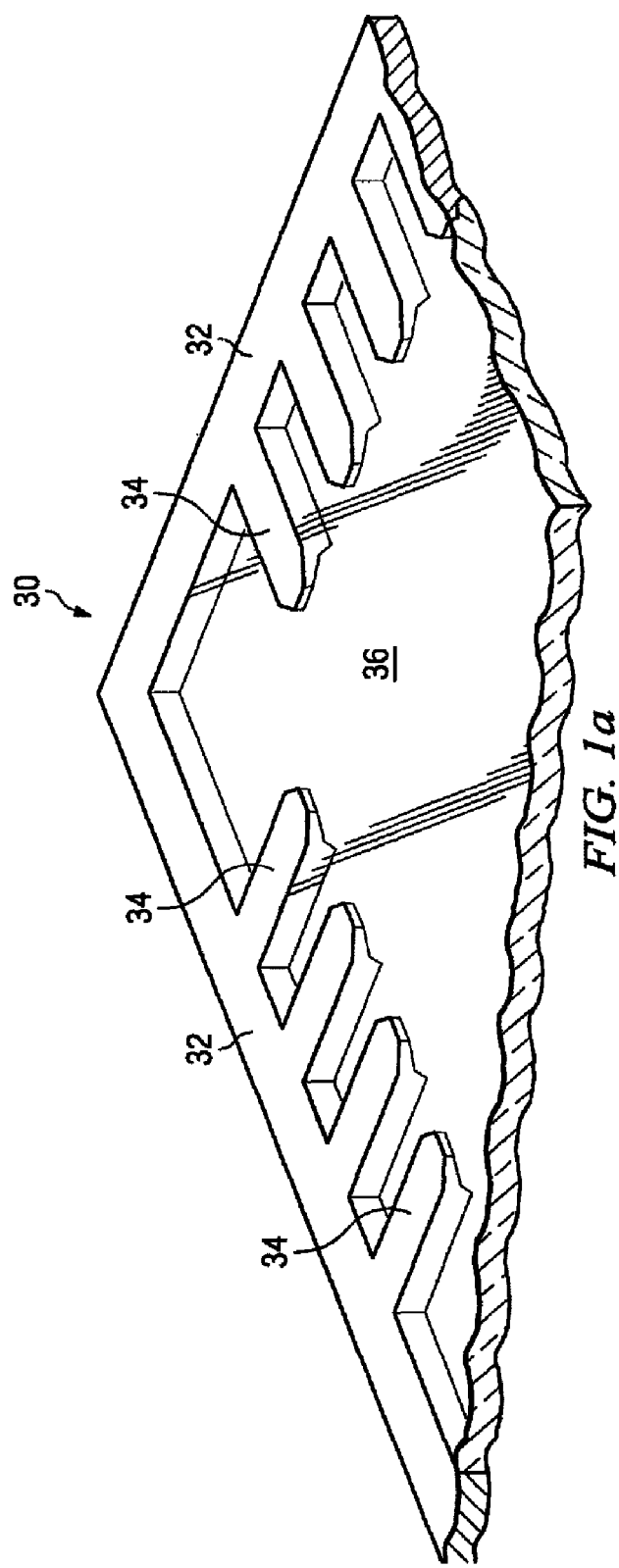
FIGS. 1a-1c illustrate a pre-molded leadframe and window with an optional dam and elevated window.

Semiconductor die are typically attached to a substrate or leadframe for structural support and interconnection. In FIG. 1a, leadframe 30 is adapted for receiving a semiconductor die. In one embodiment, leadframe 30 is an un-singulated flat pre-molded laminated substrate. Leadframe 30 includes a dam bar 32 and a plurality of fingers or contact pads 34. Leadframe 30 is made with gold, silver, nickel, platinum, copper, copper alloys (including one or more elements of nickel, iron, zinc, tin, chromium, silver, and phosphorous), or other suitable materials. A clear pre-molded window 36 is disposed in an interior portion of leadframe 30. Window 36 is made with an optical grade resin compound or other suitable light transmitting material. Window 36 is capable of passing light from external sources to semiconductor device 10.

Figure 1B:
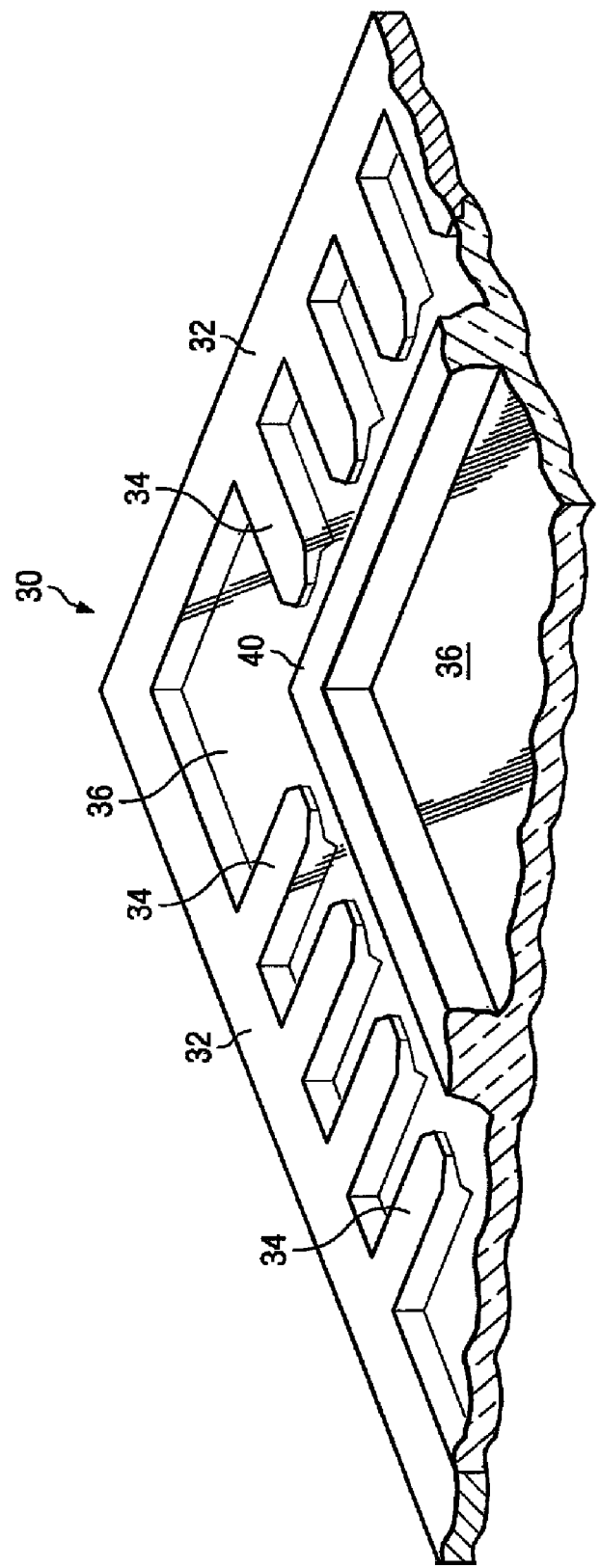
Figure 1C:
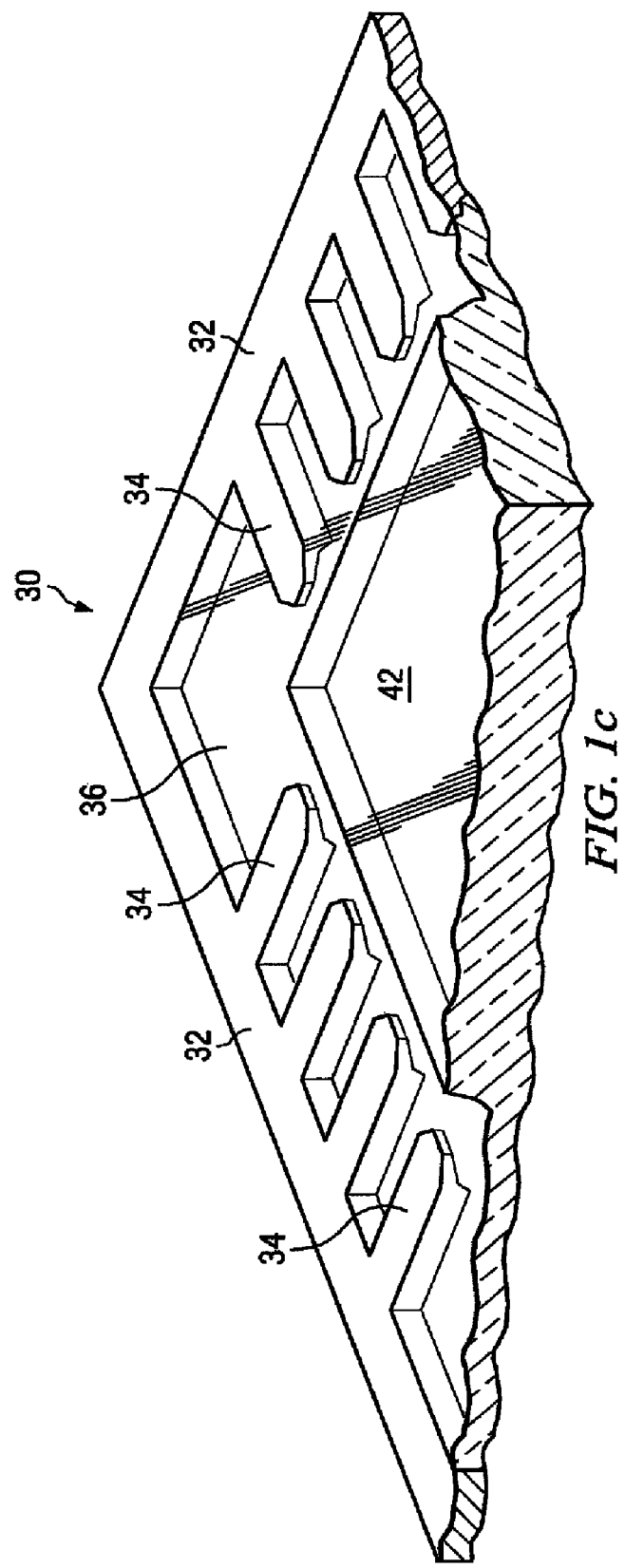

FIG. 1b shows an alternative embodiment for window 36 with dam 40 formed around a perimeter of the active window. Dam 40 is made with the same material as window 36. Dam 40 can be stepped or contoured to operate as a retaining or separation structure and provide pre-mold interlocking as discussed below. In another embodiment, FIG. 1c shows window 36 with an elevated portion (window) 42. Again, the elevated window 42 operates as a separation structure as discussed below.

Figure 2A:
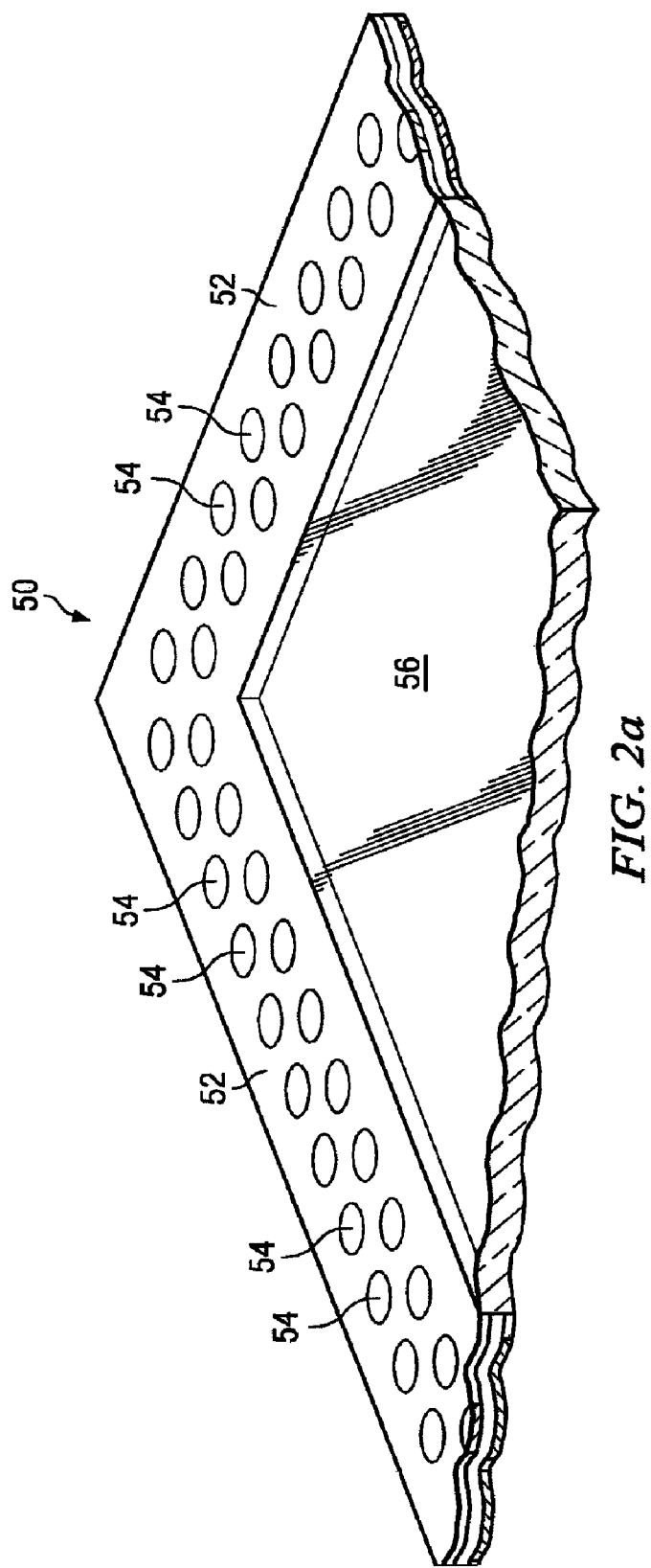
FIGS. 2a-2c illustrate a laminated leadframe with a window and optional dam and elevated window.

FIG. 2a shows leadframe 50 is a flat pre-molded laminate print circuit board (PCB) substrate 52 with a plurality of vias. The vias are filled with conductive material to form lands 54. A clear pre-molded window 56 is disposed in an interior portion of leadframe 50. Window 56 is made with an optical grade resin compound or other suitable light transmitting material. Window 56 is capable of passing light from external sources to semiconductor device 10.

Figure 2B:
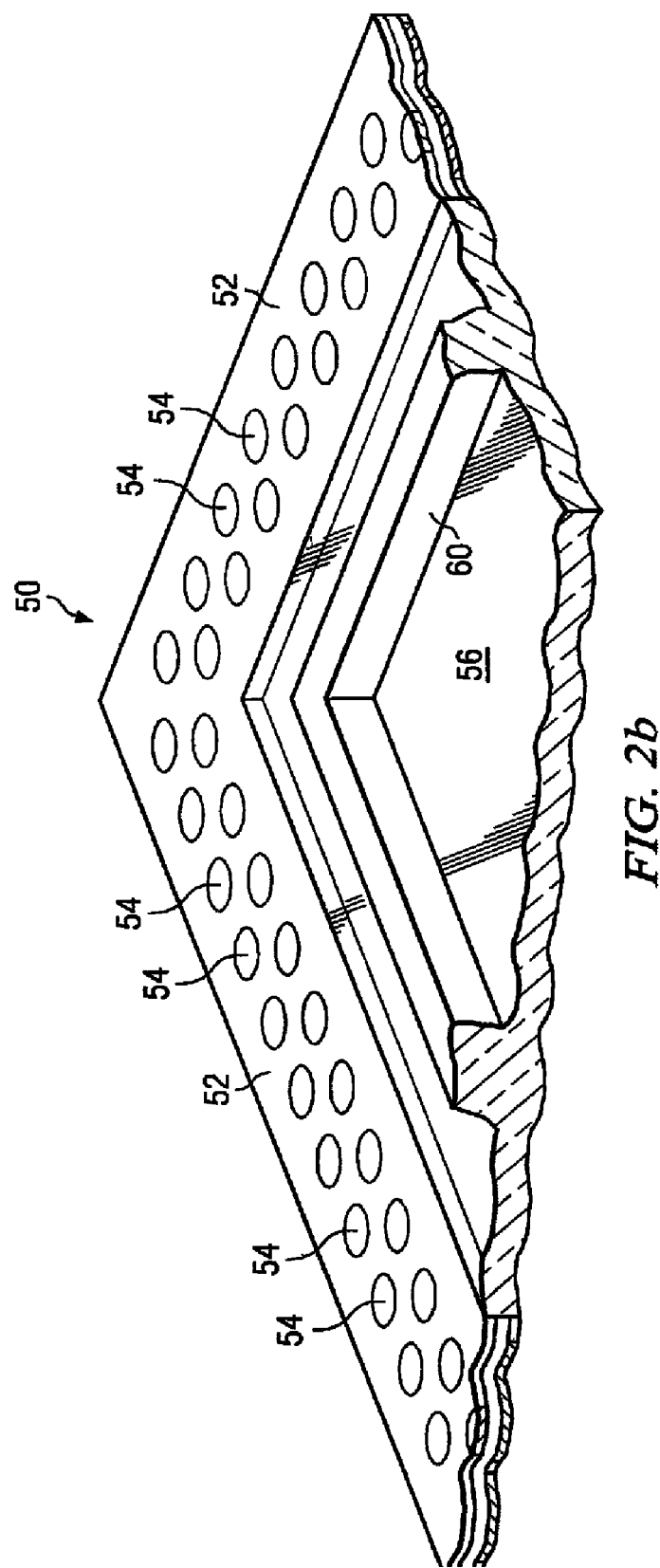
Figure 2C:
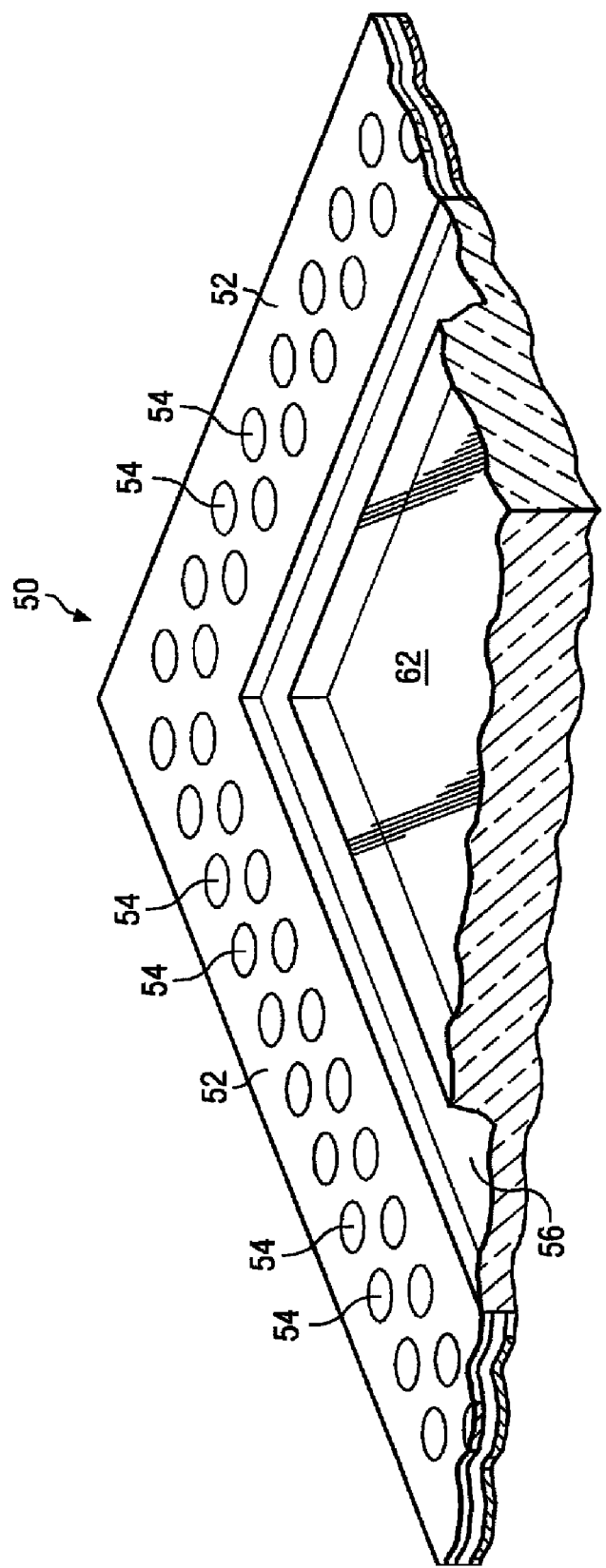

FIG. 2b shows an alternative embodiment for window 56 with dam 60 formed around a perimeter of the active window. Dam 60 can be made with the same material as window 56. Dam 60 operates as a retaining or separation structure. In another embodiment, FIG. 2c shows window 56 with an elevated portion (window) 62. Again, the elevated window 62 operates as a separation structure.

Figure 3:
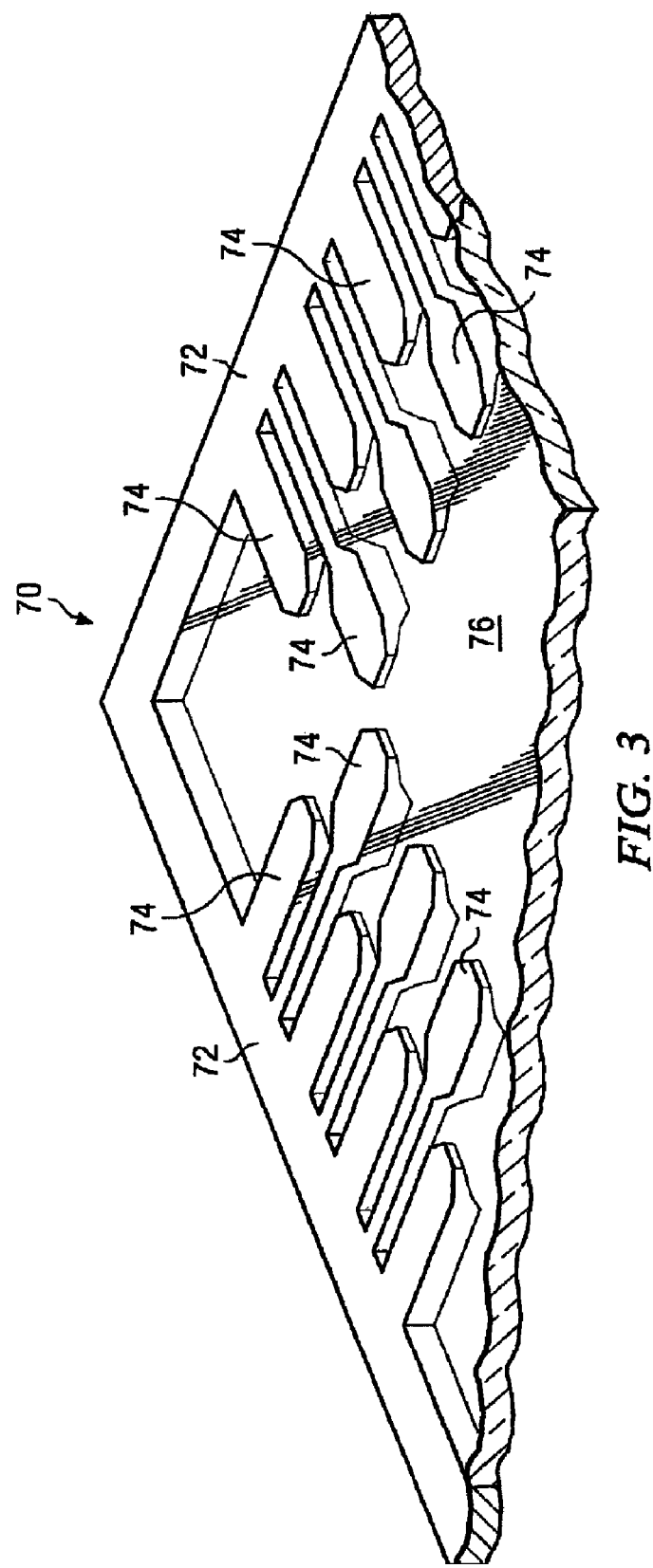
FIG. 3 illustrates a pre-molded leadframe with a window and offset contact pads.

In FIG. 3, leadframe 70 is an un-singulated flat pre-molded substrate. Leadframe 70 includes a dam bar 72 and a plurality of fingers or contact pads 74. Leadframe 70 is made with gold, silver, nickel, platinum, copper, copper alloys (including one or more elements of nickel, iron, zinc, tin, chromium, silver, and phosphorous), or other suitable materials. Adjacent ones of the contact pads 74 have different lengths and are offset to increase packing density. A clear pre-molded window 76 is disposed in an interior portion of leadframe 70. Window 76 is made with an optical grade resin compound or other suitable light transmitting material. Window 76 is capable of passing light from external sources to semiconductor device 10.

Figure 4A:
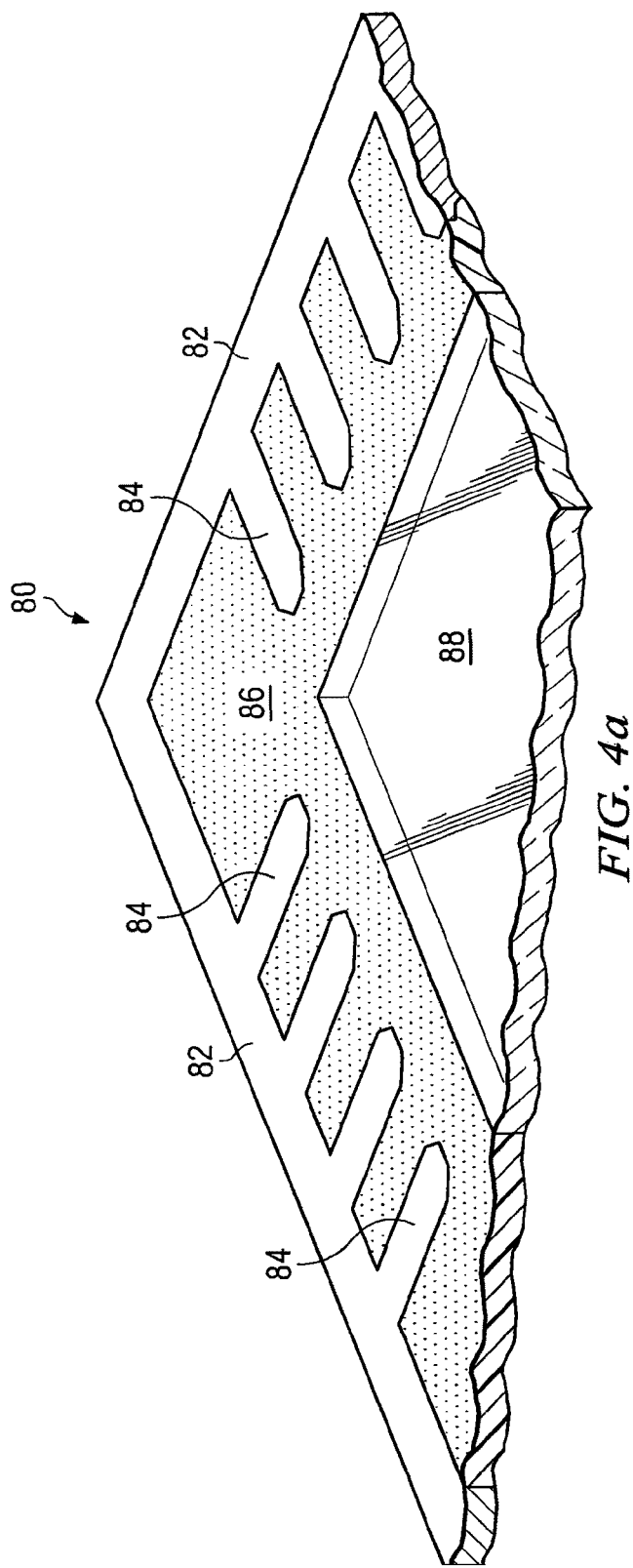
FIGS. 4a-4b illustrate a pre-molded leadframe having a window and filler material surrounding the contact pads with optional dam.
Figure 4B:
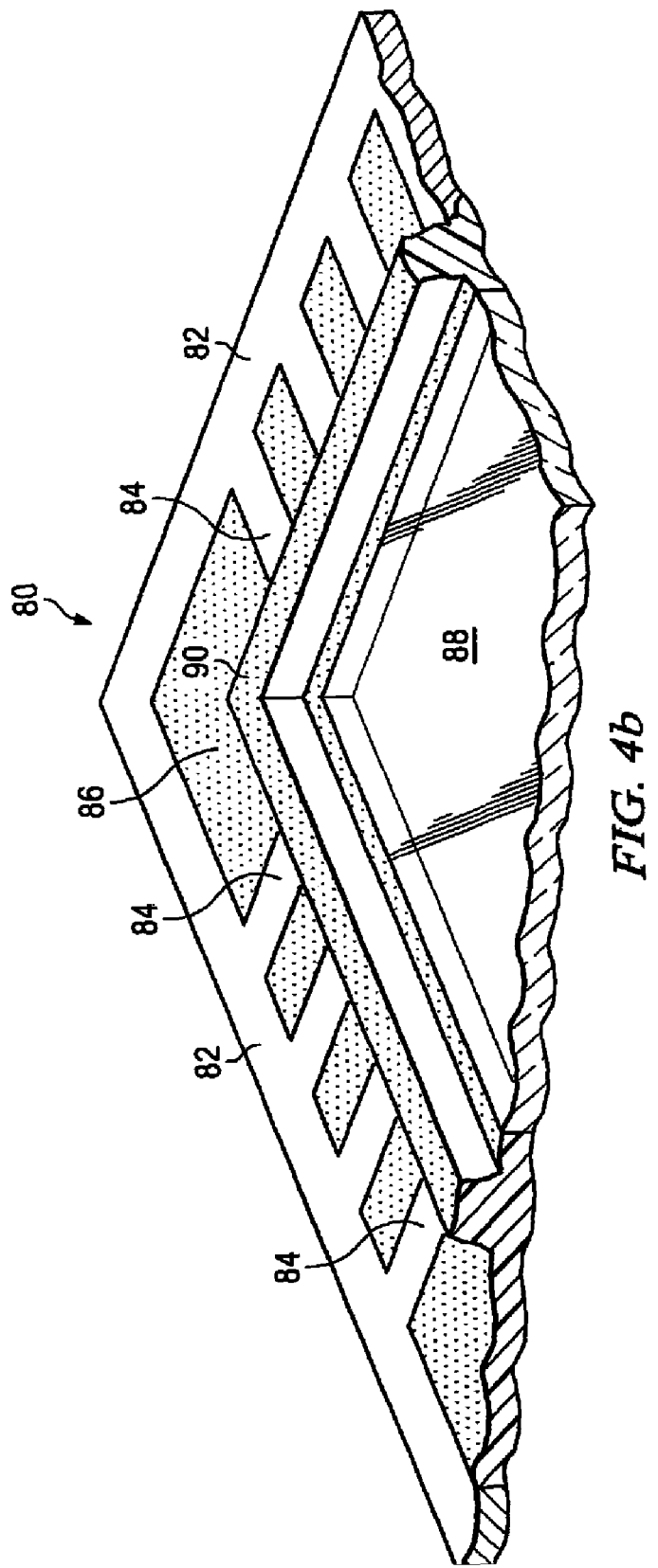

In FIG. 4a, leadframe 80 is an un-singulated flat pre-molded substrate. Leadframe 80 includes a dam bar 82 and a plurality of fingers or contact pads 84. Leadframe 80 is made with gold, silver, nickel, platinum, copper, copper alloys (including one or more elements of nickel, iron, zinc, tin, chromium, silver, and phosphorous), or other suitable materials. A pre-mold opaque filler material 86 such as an epoxy molding compound or liquid crystal polymer is disposed between contact pads 84. A clear pre-molded window 88 is embedded in an interior portion of leadframe 80 and sealed to filler material 86 with an adhesive. Window 88 is made with an optical grade resin compound or other suitable light transmitting material. Window 88 is capable of passing light from external sources to semiconductor device 10. FIG. 4b shows an alternative embodiment for leadframe 88 with dam 90 formed around a perimeter of window 86, using the same filler material 86. Dam 90 operates as a retaining or separation structure. The filler material 86 and window 88 also work with a laminate substrate as described in FIGS. 2a-2c.

Figure 5A:
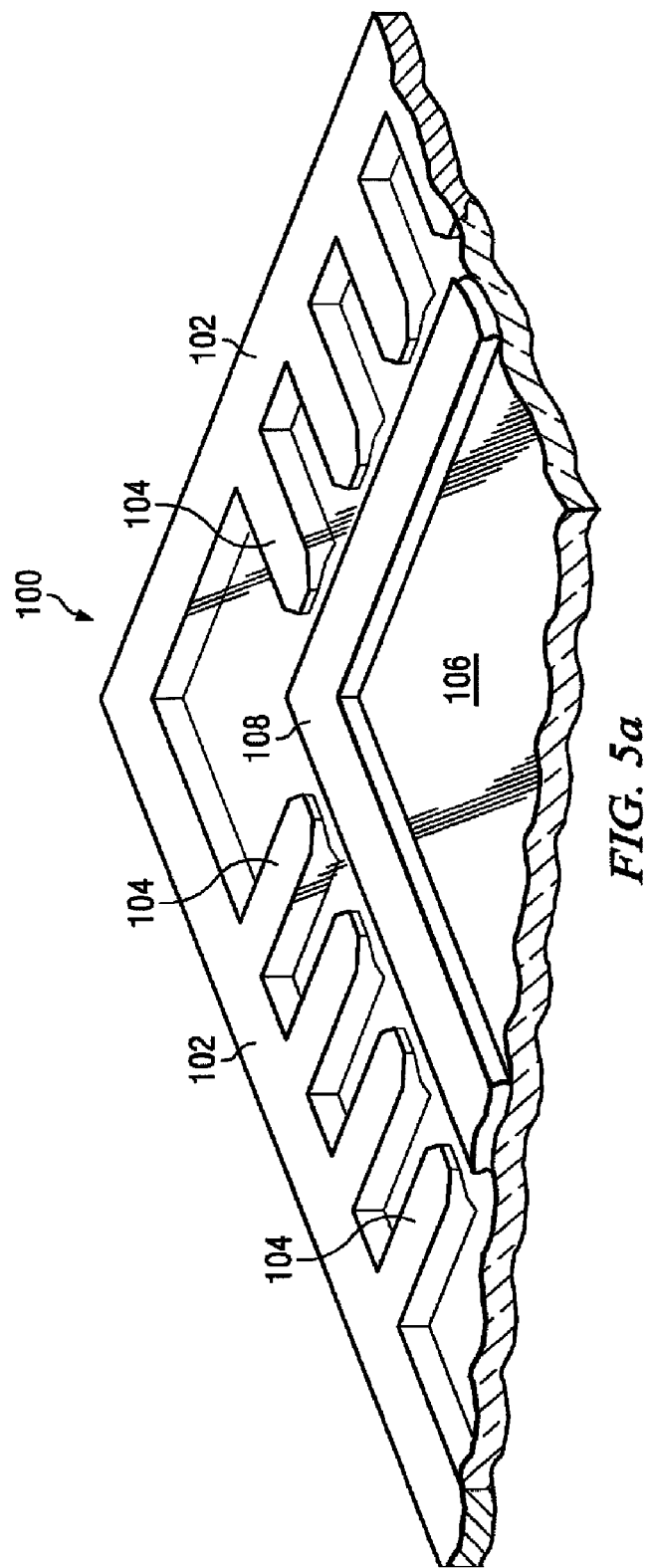
FIGS. 5a-5b illustrate a pre-molded leadframe with B-stage adhesive ring and window and optional dam.
Figure 5B:
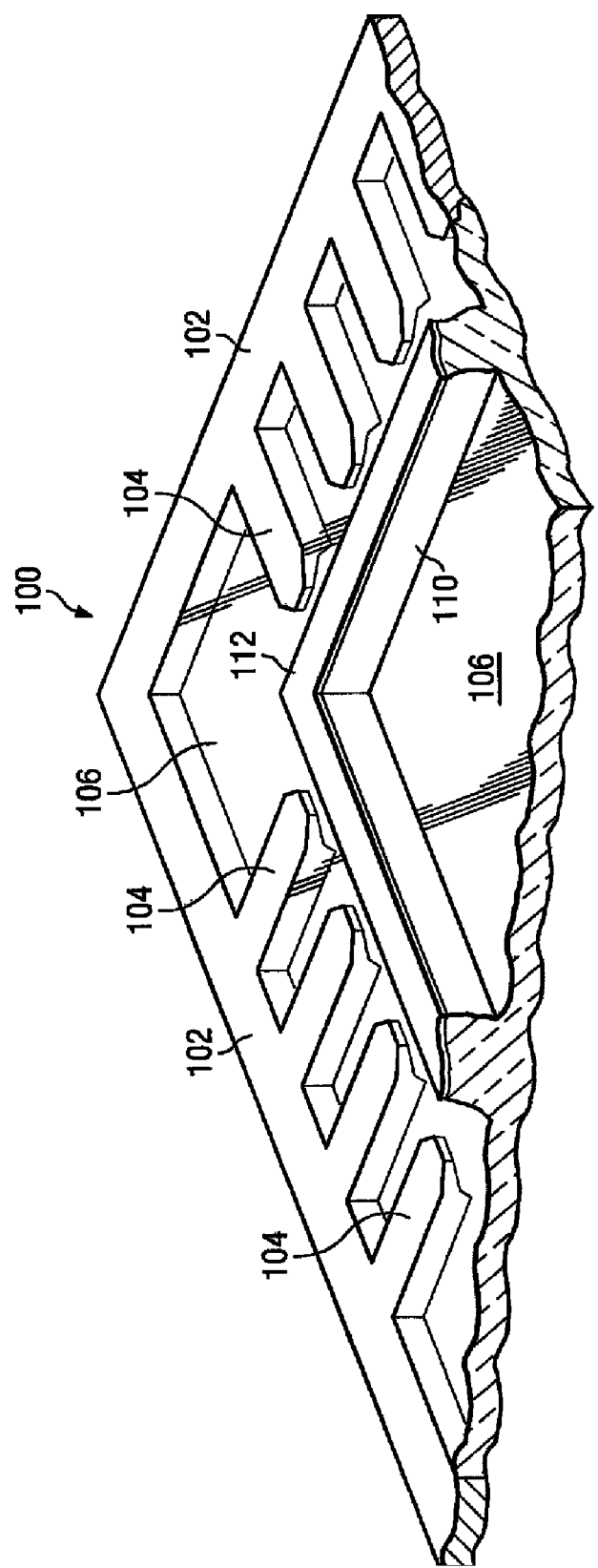

In FIG. 5a, leadframe 100 is an un-singulated flat pre-molded substrate. Leadframe 100 includes a dam bar 102 and a plurality of fingers or contact pads 104. Leadframe 100 is made with gold, silver, nickel, platinum, copper, copper alloys (including one or more elements of nickel, iron, zinc, tin, chromium, silver, and phosphorous), or other suitable materials. A clear pre-molded window 106 is disposed in an interior portion of leadframe 100. Window 106 is made with an optical grade resin compound or other suitable light transmitting material. Window 106 is capable of passing light from external sources to semiconductor device 10. An adhesive ring 108 is disposed around a perimeter of window 106. Ring 108 is made with ultraviolet (UV) irradiation B-stage adhesive such as epoxy acrylate blends, thixotropic pastes, or other suitable material. Ring 108 operates as a retaining or separation structure. In another embodiment, FIG. 5b shows dam 110 formed around a perimeter of window 106. An adhesive ring 112 is disposed on dam 110. The combination of dam 110 and ring 112 operates as a retaining or separation structure.

Figure 6:
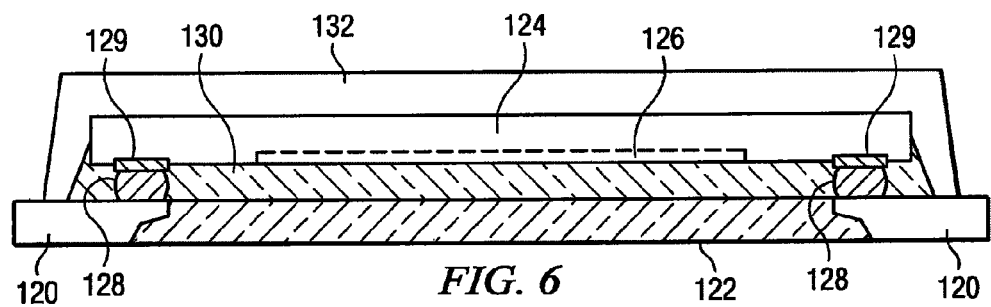
FIG. 6 is an optical semiconductor die connected to a pre-molded leadframe with a window.

FIG. 6 illustrates pre-molded leadframe 120 with window 122, e.g., any leadframe discussed in FIGS. 1-5. An optically active semiconductor die or image sensor die 124 with optically active area 126 is mechanically and electrically attached to leadframe 120 with solder bumps 128. In each case described below, the pre-molded leadframe with window simplifies the manufacturing process. The leadframe and window are a pre-molded unit. Window 122 is aligned to optically active area 126 of window 122 to provide a light transmission path. The optical devices react to light and generate electrical signals in response thereto. The electrical signals are processed by other active and passive circuits within the semiconductor die.

Solder bumps 128 are formed by depositing an electrically conductive solder material over contact pads 129 using an evaporation, electrolytic plating, electroless plating, ball drop, or screen printing process. The solder material can be any metal or electrically conductive material, e.g., tin, lead, nickel, gold, silver, copper, bismuthinite and alloys thereof. The solder material is reflowed by heating the conductive material above its melting point to form spherical balls or bumps 128. In some applications, solder bumps 128 are reflowed a second time to improve electrical contact to contact pad 129. An additional under bump metallization can optionally be formed under solder bumps 128. An optical grade underfill material 130 is disposed under semiconductor die 124. Solder bumps 128 provide electrical interconnect for semiconductor die 124, as well as other semiconductor devices or external electrical connections.

A molding compound 132 is disposed over leadframe 120 and semiconductor die 124. Molding compound 132 can be made with epoxide resins, silica, cresol novolac epoxy, phenol novolac, antimony, bromide, or carbon.

Figure 7:
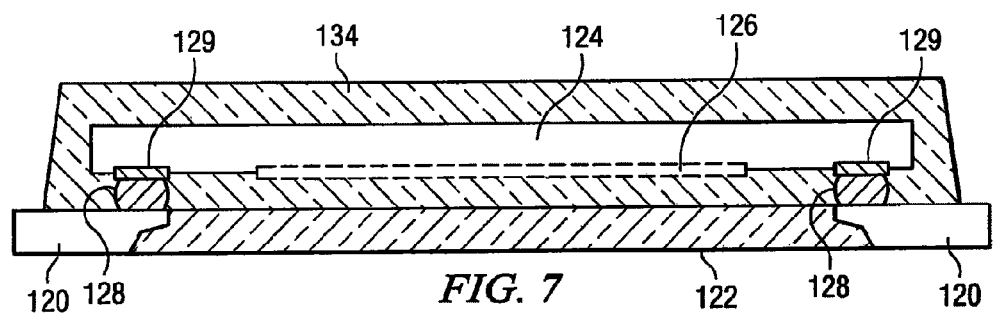
FIG. 7 is an optical semiconductor die connected to a pre-molded leadframe with a window and clear encapsulant surrounding the die.

FIG. 7 illustrates pre-molded leadframe 120 with window 122, e.g., any leadframe discussed in FIGS. 1-5. A semiconductor die 124 with optically active area 126 is mechanically and electrically attached to leadframe 120 with solder bumps 128. An optical grade material 134 is disposed above and below semiconductor die 124.

Figure 8:
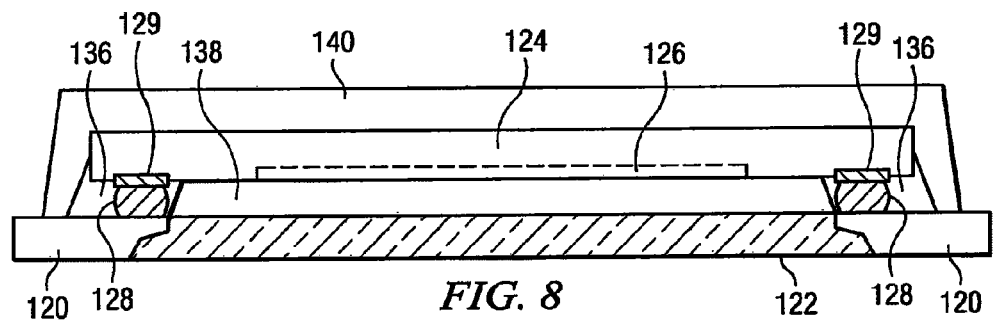
FIG. 8 is an optical semiconductor die connected to a pre-molded leadframe with a window and having underfill material around solder bump.

FIG. 8 illustrates pre-molded leadframe 120 with window 122, e.g., any leadframe discussed in FIGS. 1-5. A semiconductor die 124 with optically active area 126 is mechanically and electrically attached to leadframe 120 with solder bumps 128. An underfill material 136 is disposed under semiconductor die 124 around solder bumps 128, but does not occupy area 138 above window 122. Area 138 is devoid of material. The underfill material 136 can be epoxy, polymeric material, film, or other non-conductive material. A molding compound 140 is disposed over leadframe 120 and semiconductor die 124. Molding compound 140 can be made with epoxide resins, silica, cresol novolac epoxy, phenol novolac, antimony, bromide, or carbon.

Figure 9:
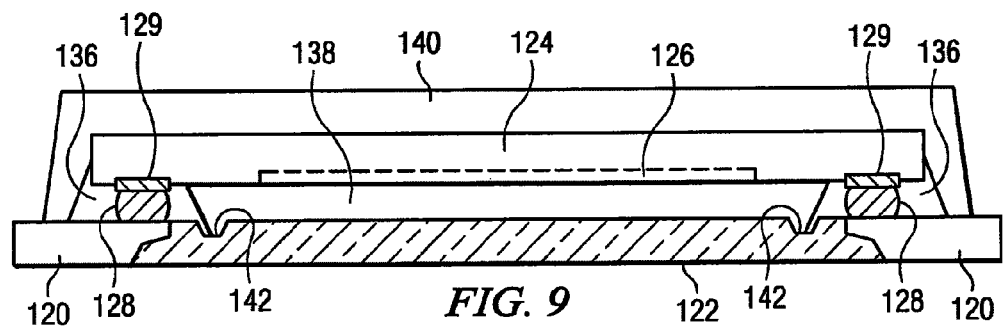
FIG. 9 is an optical semiconductor die connected to a pre-molded leadframe with a window having notches to contain underfill material.

FIG. 9 illustrates pre-molded leadframe 120 with window 122, e.g., any leadframe discussed in FIGS. 1-5. A semiconductor die 124 with optically active area 126 is mechanically and electrically attached to leadframe 120 with solder bumps 128. An underfill material 136 is disposed under semiconductor die 124 around solder bumps 128, but does not occupy area 138 above window 122. Area 138 is devoid of material. The underfill material 136 can be epoxy, polymeric material, film, or other non-conductive material. In this embodiment, window 122 includes notches 142 to prevent the underfill material from encroaching onto window 122. Excess underfill material 136 is captured and held in notches 142, which keeps window 122 free to pass maximum light. The notches 142 prevent the underfill material from blocking the light transmission path through window 122. A molding compound 140 is disposed over leadframe 120 and semiconductor die 124.

Figure 10:
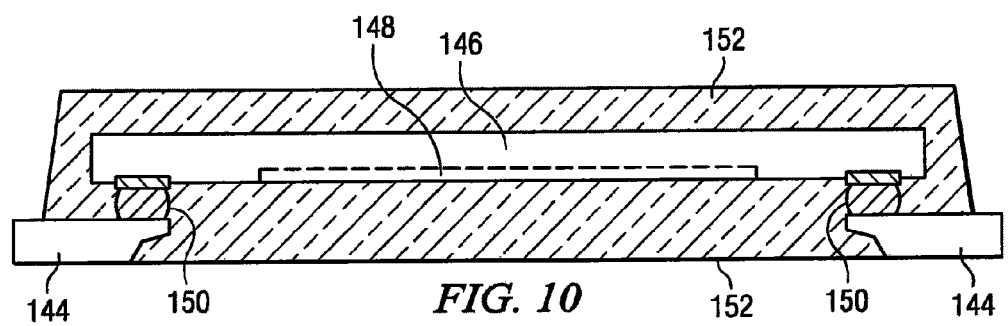
FIG. 10 is an optical semiconductor die connected to a leadframe and clear encapsulant surrounding the die.

In FIG. 10, a leadframe 144 is shown without the pre-molded window. A semiconductor die 146 with optically active area 148 is mechanically and electrically attached to leadframe 144 with solder bumps 150. An encapsulant 152, such as a clear epoxy molding compound, is disposed above and below semiconductor die 146 to pass light through leadframe 144 to optically active area 148.

Figure 11:
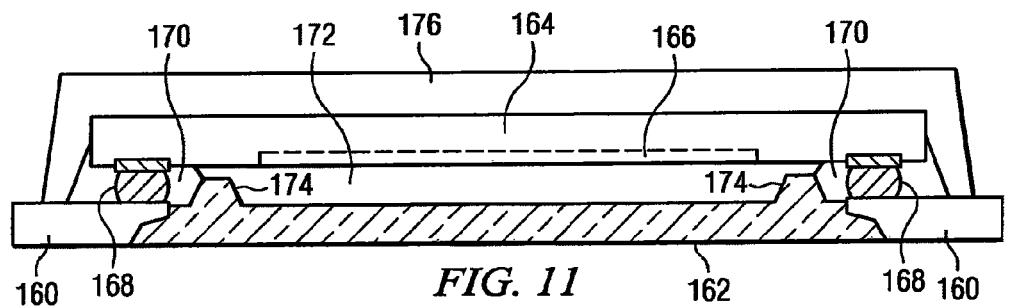
FIG. 11 is an optical semiconductor die connected to a pre-molded leadframe with a window having a dam to contain underfill material.

FIG. 11 illustrates pre-molded leadframe 160 with window 162. A semiconductor die 164 with optically active area 166 is mechanically and electrically attached to leadframe 160 with solder bumps 168. Window 162 is aligned to optically active area 166 to provide a light transmission path. An underfill material 170 is disposed under semiconductor die 164 around solder bumps 168, but does not occupy area 172 above window 162. Area 172 is devoid of material. In this embodiment, window 162 includes dam 174, such as shown in FIGS. 1b and 2b, to prevent the underfill material from encroaching onto window 162. Excess underfill material 170 is held back by dam 174, which keeps window 162 free to pass maximum light. The dam 174 prevents the underfill material from blocking the light transmission path through window 162. The underfill material 170 can be epoxy, polymeric material, film, or other non-conductive material. Solder bumps 168 can be sized to create a gap between dam 174 and semiconductor die 164. A molding compound 176 is disposed over leadframe 160 and semiconductor die 164. Molding compound 176 can be made with epoxide resins, silica, cresol novolac epoxy, phenol novolac, antimony, bromide, or carbon.

Figure 12:
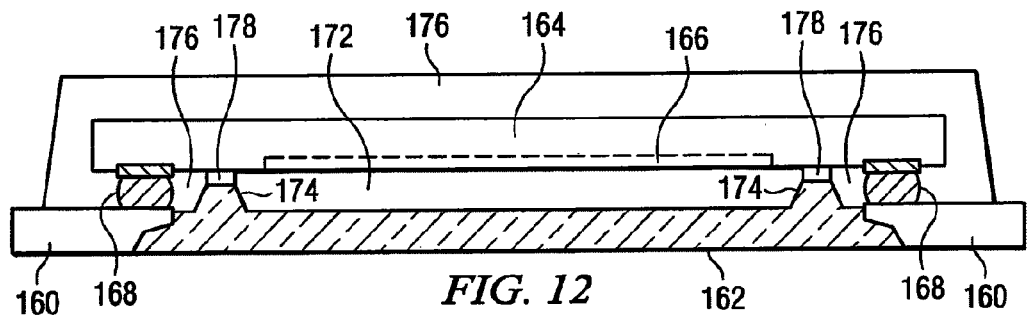
FIG. 12 is an optical semiconductor die connected to a pre-molded leadframe with a window having a dam and B-stage ring to contain molding compound.

FIG. 12 illustrates pre-molded leadframe 160 with window 162. A semiconductor die 164 with optically active area 166 is mechanically and electrically attached to leadframe 160 with solder bumps 168. In this embodiment, window 162 includes dam 174 to prevent any material from encroaching onto window 162. A B-stage adhesive ring 178 is disposed on top of dams 174, as shown in FIG. 5b, and adheres to semiconductor die 164. Adhesive ring 178 can be pre-applied or dispensed during the process. A molding compound 176 is disposed over leadframe 160 and semiconductor die 164. The molding compound 176 ingresses under semiconductor die 164 around solder bumps 168, but does not occupy area 172 above window 162. Area 172 is devoid of material. Excess molding compound 176 is held back by dam 174, which keeps window 162 free to pass maximum light.

Figure 13:
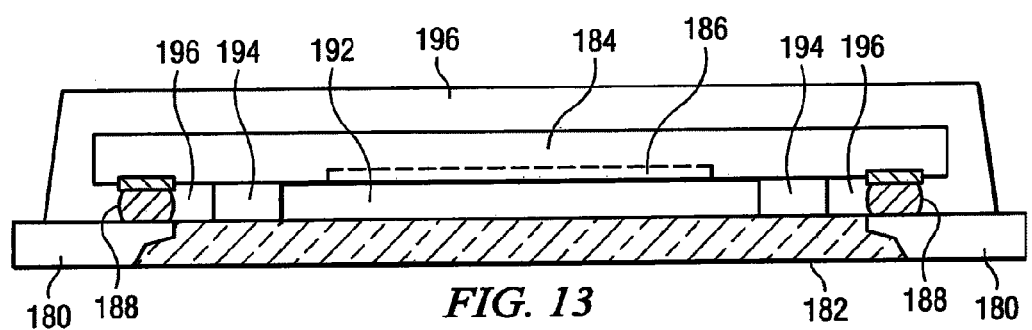
FIG. 13 is an optical semiconductor die connected to a pre-molded leadframe with a B-stage ring to contain molding compound.

FIG. 13 illustrates pre-molded leadframe 180 with window 182. A semiconductor die 184 with optically active area 186 is mechanically and electrically attached to leadframe 180 with solder bumps 188. Window 182 is aligned to optically active area 186 to provide a light transmission path. In this embodiment, a B-stage adhesive ring 194 is disposed on window 182, as shown in FIG. 5a, and adheres to semiconductor die 184. Adhesive ring 194 can be pre-applied or dispensed during the process. A molding compound 196 is disposed over leadframe 180 and semiconductor die 184. The molding compound 196 ingresses under semiconductor die 184 around solder bumps 188, but does not occupy area 192 above window 182. Area 192 is devoid of material. Excess molding compound 196 is held back by ring 194, which keeps window 182 free to pass maximum light. The ring 194 prevents the molding compound from blocking the light transmission path through window 182.

Figure 14:
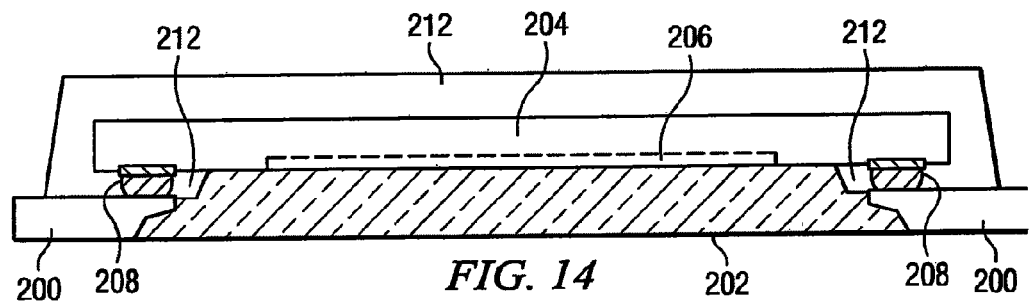
FIG. 14 is an optical semiconductor die connected to a pre-molded leadframe with an elevated window to contain molding compound.

FIG. 14 illustrates pre-molded leadframe 200 with elevated window 202. A semiconductor die 204 with optically active area 206 is mechanically and electrically attached to leadframe 200 with solder bumps 208. A molding compound 212 is disposed over leadframe 200 and semiconductor die 204. The molding compound 212 ingresses under semiconductor die 204 around solder bumps 208. In this embodiment, the elevated window 202, as shown in FIGS. 1c and 2c, holds back excess molding compound 212, which keeps window 202 free to pass maximum light. The elevated portion of window 202 prevents the molding compound from blocking the light transmission path.

Figure 15:
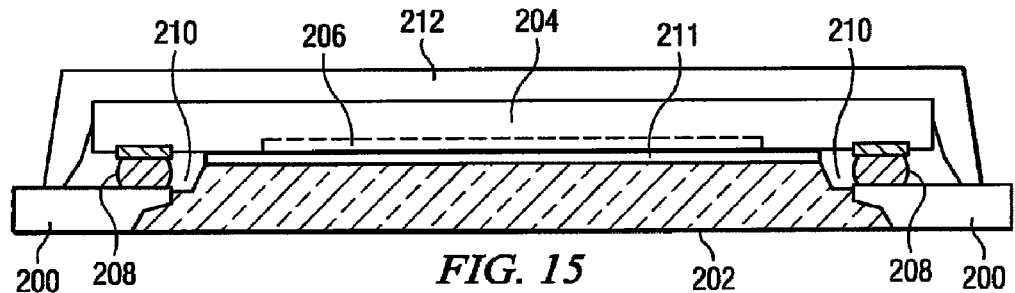
FIG. 15 is an optical semiconductor die connected to a pre-molded leadframe with an elevated window to contain molding compound.

FIG. 15 illustrates pre-molded leadframe 200 with elevated window 202, as described in FIGS. 1c and 2c. A semiconductor die 204 with optically active area 206 is mechanically and electrically attached to leadframe 200 with solder bumps 208. An underfill material 210 is disposed under semiconductor die 204 around solder bumps 208. In this embodiment, the elevated window 202, as shown in FIGS. 1c and 2c, holds back excess underfill material 210, which keeps window 202 free to pass maximum light. The underfill material 210 can be epoxy, polymeric material, film, or other non-conductive material. Solder bumps 208 can be sized to create a gap 211 between elevated window 202 and semiconductor die 204. A molding compound 212 is disposed over leadframe 200 and semiconductor die 204.

Figure 16:
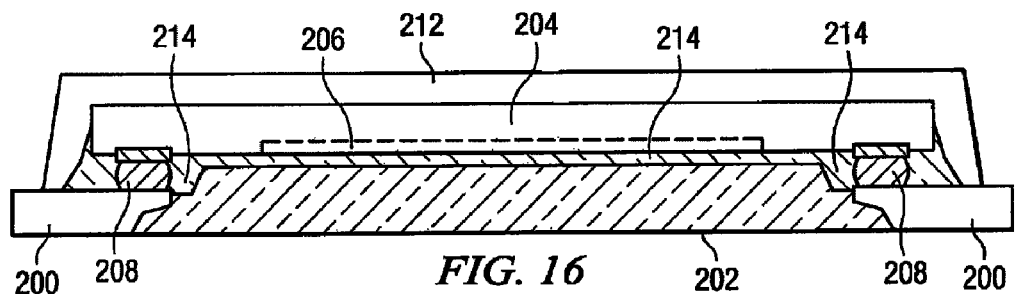
FIG. 16 is an optical semiconductor die connected to a pre-molded leadframe with an elevated window and clear underfill material.

FIG. 16 illustrates pre-molded leadframe 200 with elevated window 202, as described in FIGS. 1c and 2c. A semiconductor die 204 with optically active area 206 is mechanically and electrically attached to leadframe 200 with solder bumps 208. Solder bumps 208 can be sized to create a gap between elevated window 202 and semiconductor die 204. In this embodiment, a clear underfill material 214 is disposed under semiconductor die 204 and around solder bumps 208. The clear underfill material 214 also creeps into the gap under semiconductor die 204. A molding compound 212 is disposed over leadframe 200 and semiconductor die 204.

Figure 17:
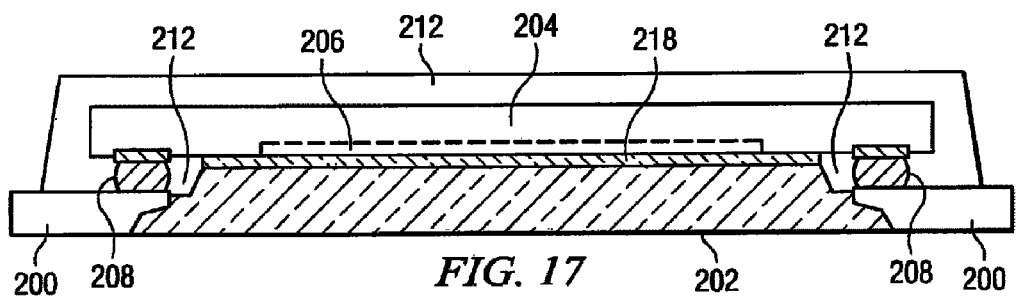
FIG. 17 is an optical semiconductor die connected to a pre-molded leadframe with an elevated window and clear adhesive.

FIG. 17 illustrates pre-molded leadframe 200 with elevated window 202, as described in FIGS. 1c and 2c. A semiconductor die 204 with optically active area 206 is mechanically and electrically attached to leadframe 200 with solder bumps 208. In this embodiment, a clear adhesive 218 is disposed over window 202 prior to die attach. A molding compound 212 is disposed over leadframe 200 and semiconductor die 204. The molding compound 212 ingresses under semiconductor die 204 around solder bumps 208. In this embodiment, the elevated window 202, as shown in FIGS. 1c and 2c, and clear adhesive 218 holds back excess molding compound 212, which keeps window 202 free to pass maximum light.

Figure 18:
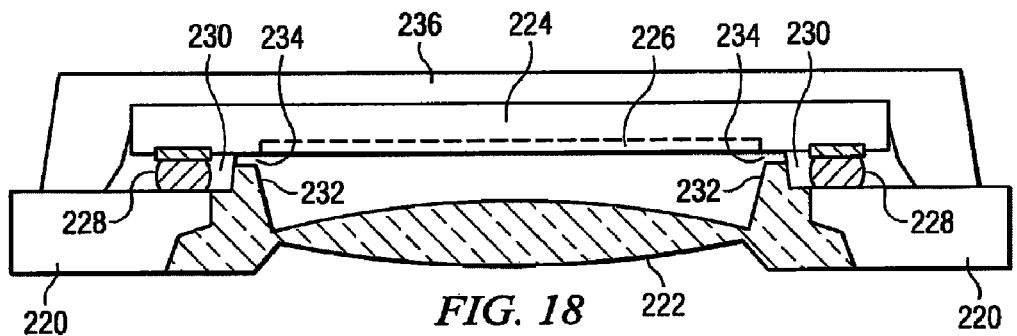
FIG. 18 is an optical semiconductor die connected to a pre-molded leadframe with convex lens having a dam to contain underfill material.

FIG. 18 illustrates pre-molded leadframe 220 with the light transmitting material formed as convex lens 222. A semiconductor die 224 with optically active area 226 is mechanically and electrically attached to leadframe 220 with solder bumps 228. The convex lens focuses light onto optically active area 226. An underfill material 230 is disposed under semiconductor die 224 around solder bumps 228. In this embodiment, dam 232 holds back excess underfill material 230, which keeps window 222 free to pass maximum light. The underfill material 230 can be epoxy, polymeric material, film, or other non-conductive material. Solder bumps 208 can be sized to create a gap 234 between dam 232 and semiconductor die 224. A molding compound 236 is disposed over leadframe 220 and semiconductor die 224.

Figure 19:
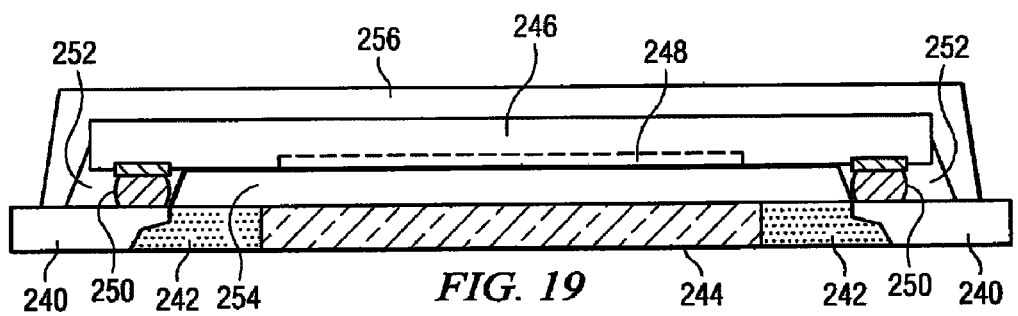
FIG. 19 is an optical semiconductor die connected to a pre-molded leadframe having filler material and embedded glass.

FIG. 19 illustrates pre-molded leadframe 240 with opaque filler material 242 and embedded glass 244, as described in FIG. 4a. A semiconductor die 246 with optically active area 248 is mechanically and electrically attached to leadframe 240 with solder bumps 250. An underfill material 252 is disposed under semiconductor die 246 around solder bumps 250, but does not occupy area 254 above window 244. Area 254 is devoid of material. The underfill material 252 can be epoxy, polymeric material, film, or other non-conductive material. A molding compound 256 is disposed over leadframe 240 and semiconductor die 246. Molding compound 256 can be made with epoxide resins, silica, cresol novolac epoxy, phenol novolac, antimony, bromide, or carbon.

Figure 20:
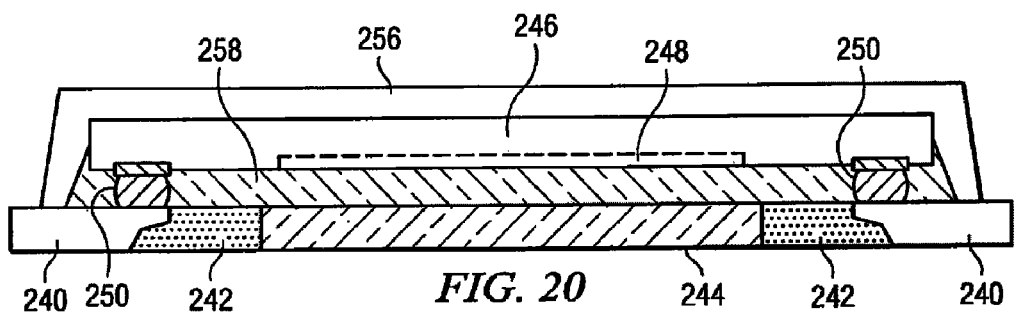
FIG. 20 is an optical semiconductor die connected to a pre-molded leadframe having filler material and embedded glass and clear underfill material.

FIG. 20 illustrates pre-molded leadframe 240 with opaque filler material 242 and embedded glass 244, as described in FIG. 4a. A semiconductor die 246 with optically active area 248 is mechanically and electrically attached to leadframe 240 with solder bumps 250. In this embodiment, a clear underfill material 258 is disposed under semiconductor die 246 and around solder bumps 250. A molding compound 256 is disposed over leadframe 240 and semiconductor die 246.

Figure 21:
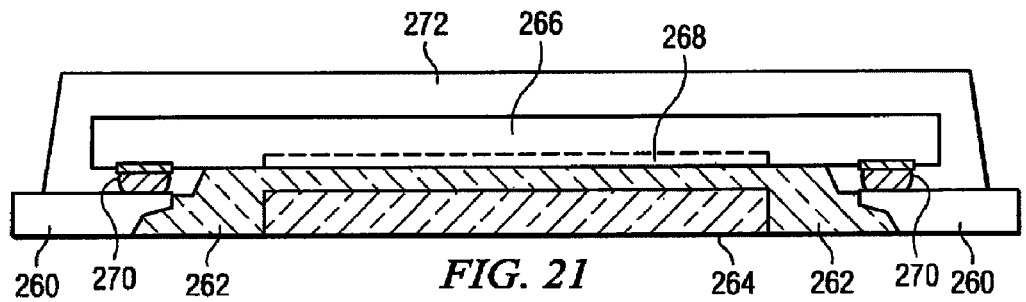
FIG. 21 is an optical semiconductor die connected to a pre-molded leadframe with an elevated window and embedded glass.

FIG. 21 illustrates pre-molded leadframe 260 with elevated window 262 having embedded glass 264. A semiconductor die 266 with optically active area 268 is mechanically and electrically attached to leadframe 260 with solder bumps 270.

A molding compound 272 is disposed over leadframe 260 and semiconductor die 266. The molding compound 272 ingresses under semiconductor die 266 around solder bumps 270. In this embodiment, the elevated window 262 holds back excess molding compound 272, which keeps window 262 free to pass maximum light.

Figure 22:
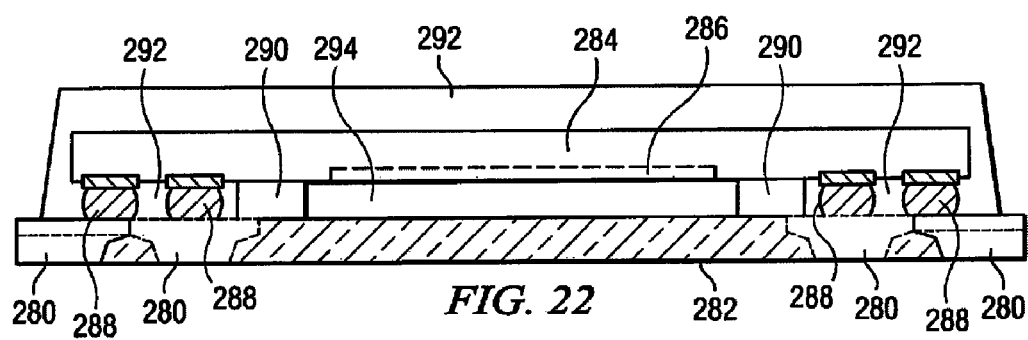
FIG. 22 is an optical semiconductor die connected to a pre-molded leadframe having offset contact pads and a window and B-stage ring.

FIG. 22 illustrates pre-molded leadframe 280 with inner and outer leads and window 282, e.g., as described in FIG. 3. A semiconductor die 284 with optically active area 286 is mechanically and electrically attached to leadframe 280 with solder bumps 288. In this embodiment, a B-stage adhesive ring 290 is disposed on window 282, as shown in FIG. 5a, and adheres to semiconductor die 284. Adhesive ring 290 can be pre-applied or dispensed during the process. A molding compound 292 is disposed over leadframe 280 and semiconductor die 284. The molding compound 292 ingresses under semiconductor die 284 around solder bumps 288, but does not occupy area 294 above window 282. Area 294 is devoid of material. Excess molding compound 292 is held back by ring 290, which keeps window 282 free to pass maximum light. The ring 290 prevents the molding compound from blocking the light transmission path through window 282.

Figure 23:
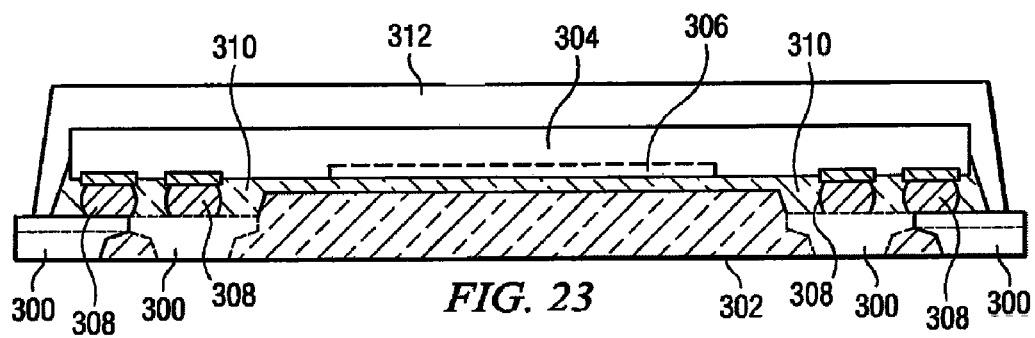
FIG. 23 is an optical semiconductor die connected to a pre-molded leadframe having offset contact pads and an elevated window and clear underfill material.

FIG. 23 illustrates pre-molded leadframe 300 with inner and outer leads and elevated window 302, e.g., as described in FIG. 3. A semiconductor die 304 with optically active area 306 is mechanically and electrically attached to leadframe 300 with solder bumps 308. Solder bumps 308 can be sized to create a gap between elevated window 302 and semiconductor die 304. In this embodiment, a clear underfill material 310 is disposed under semiconductor die 304 and around solder bumps 308. The clear underfill material 310 also creeps into the gap under semiconductor die 304. A molding compound 312 is disposed over leadframe 300 and semiconductor die 304.

Figure 24:
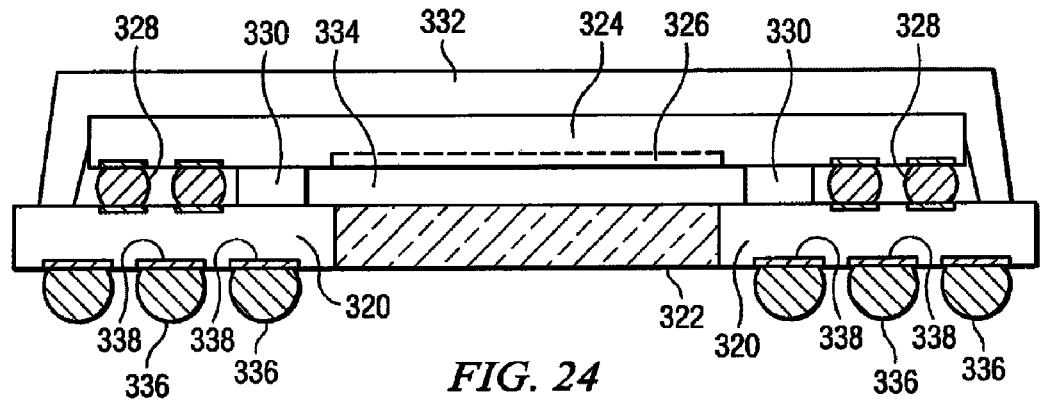
FIG. 24 is an optical semiconductor die connected to a pre-molded laminated substrate with a window and B-stage ring.

FIG. 24 illustrates pre-molded laminated substrate 320 and window 322, e.g., as described in FIG. 2a. A semiconductor die 324 with optically active area 326 is mechanically and electrically attached to leadframe 320 with solder bumps 328. In this embodiment, a B-stage adhesive ring 330 is disposed on leadframe 320 around window 322, as shown in FIG. 5a, and adheres to semiconductor die 324. Adhesive ring 330 can be pre-applied or dispensed during the process. A molding compound 332 is disposed over leadframe 320 and semiconductor die 324. The molding compound 332 ingresses under semiconductor die 324 around solder bumps 328, but does not occupy area 334 above window 322. Area 334 is devoid of material. Excess molding compound 332 is held back by ring 330, which keeps window 322 free to pass maximum light. Solder bumps 336 mechanically and electrically connect to lands 338 which pass through leadframe 320.

Figure 25:
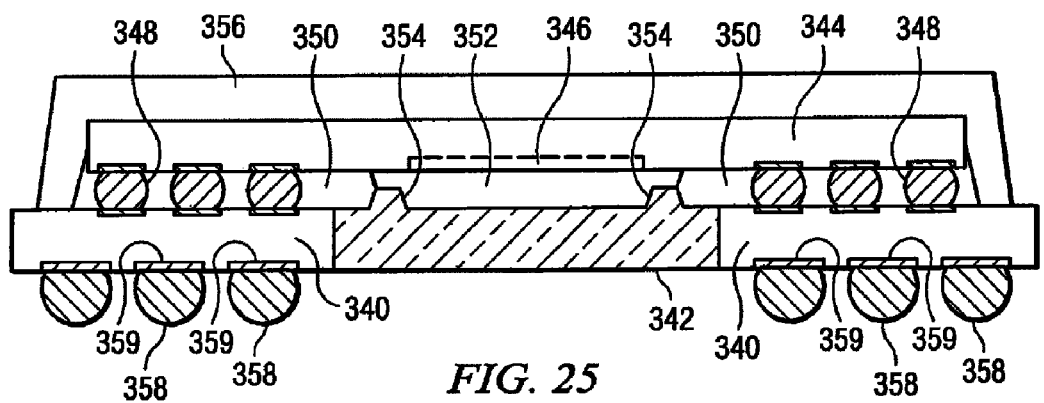
FIG. 25 is an optical semiconductor die connected to a pre-molded laminated substrate with a window having a dam to contain underfill material.

FIG. 25 illustrates pre-molded laminated substrate 340 and window 342. A semiconductor die 344 with optically active area 346 is mechanically and electrically attached to leadframe 340 with solder bumps 348. An underfill material 350 is disposed under semiconductor die 344 around solder bumps 348, but does not occupy area 352 above window 342. Area 352 is devoid of material. In this embodiment, window 342 includes dam 354, such as shown in FIG. 2b, to prevent the underfill material from encroaching onto window 342. Excess underfill material 350 is held back by dam 354, which keeps window 342 free to pass maximum light. The underfill material 350 can be epoxy, polymeric material, film, or other non-conductive material. Solder bumps 348 can be sized to create a gap between dam 354 and semiconductor die 344. A molding compound 356 is disposed over leadframe 340 and semiconductor die 344. Molding compound 356 can be made with epoxide resins, silica, cresol novolac epoxy, phenol novolac, antimony, bromide, or carbon. Solder bumps 358 mechanically and electrically connect to lands 359 which pass through leadframe 340.

Figure 26:
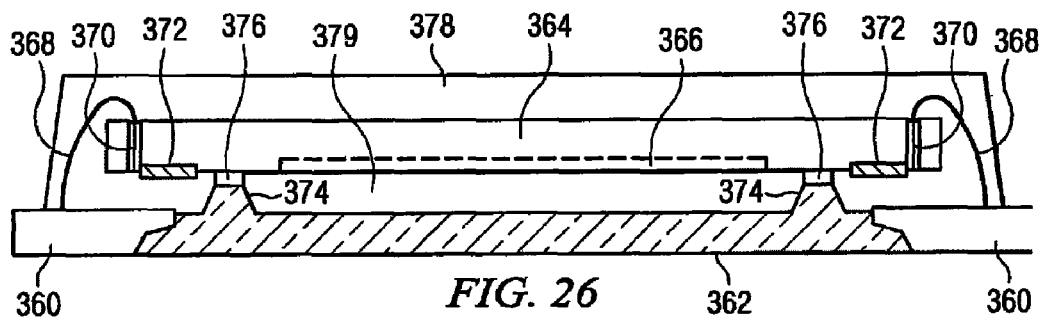
FIG. 26 is an optical semiconductor die connected to a pre-molded leadframe by wire bonds and having a window with a dam and B-stage ring over the dam.

FIG. 26 illustrates pre-molded leadframe 360 with window 362. A semiconductor die 364 with optically active area 366 is mechanically and electrically attached to leadframe 360 with bond wires 368. Bond wires 368 connect by way of through hole vias (THV) 370 to contact pads 372. Bond wires 368 provide electrical interconnect for semiconductor die 364, as well as other semiconductor devices or external electrical connections. In this embodiment, window 362 includes dam 374 to prevent any material from encroaching onto window 362. A B-stage adhesive ring 376 is disposed on top of dams 374, as shown in FIG. 5b, and adheres to semiconductor die 364. Adhesive ring 376 can be pre-applied or dispensed during the process. A molding compound 378 is disposed over leadframe 360 and semiconductor die 364. The molding compound 378 ingresses under semiconductor die 364, but does not occupy area 379 above window 362. Area 379 is devoid of material. Excess molding compound 378 is held back by dam 374 and ring 376, which keeps window 362 free to pass maximum light.

Figure 27:
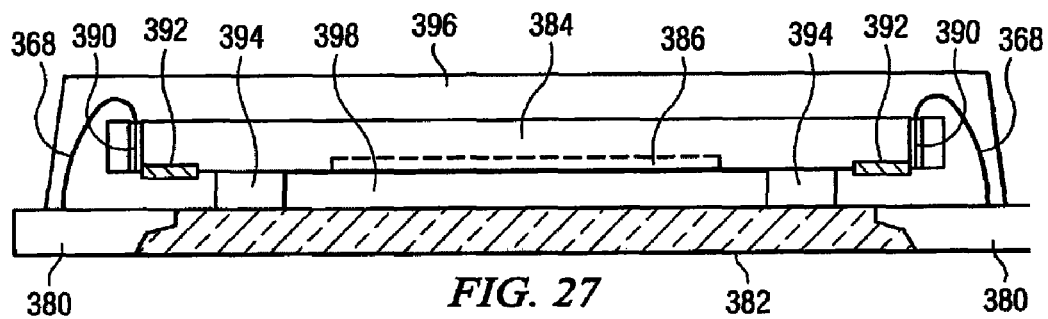
FIG. 27 is an optical semiconductor die connected to a pre-molded leadframe by wire bonds and having a window and B-stage ring to contain encapsulant.

FIG. 27 illustrates pre-molded leadframe 380 and window 382, e.g., as described in FIG. 2a. A semiconductor die 384 with optically active area 386 is mechanically and electrically attached to leadframe 380 with bond wires 388. Bond wires 388 connect by way of THV 390 to contact pads 392. In this embodiment, a B-stage adhesive ring 394 is disposed on window 382, as shown in FIG. 5a, and adheres to semiconductor die 384. Adhesive ring 394 can be pre-applied or dispensed during the process. A molding compound 396 is disposed over leadframe 380 and semiconductor die 384. The molding compound 396 ingresses under semiconductor die 384, but does not occupy area 398 above window 382. Area 398 is devoid of material. Excess molding compound 396 is held back by ring 394, which keeps window 382 free to pass maximum light.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing an optical semiconductor die having an optically active area that generates electrical signals in response to the optically active area reacting to light;
   providing a leadframe having a dam bar and a plurality of contact pads formed as fingers that extend away from the dam bar;
   disposing a light transmitting material around the fingers and between the dam bar, the light transmitting material including an elevated area vertically offset with respect to the leadframe;
   attaching the optical semiconductor die to the leadframe so that the optically active area of the optical semiconductor die is aligned with the light transmitting material to provide a light transmission path to the optically active area; and
   disposing an underfill material around the light transmission path and between the optical semiconductor die and leadframe such that the underfill material contacts a sidewall of the elevated area.

2. The method of claim 1, wherein the elevated area includes a dam surrounding the light transmission path.

3. The method of claim 1, further including:
   forming a plurality of vias in the optical semiconductor die; and
   electrically connecting the plurality of vias to the leadframe.

4. The method of claim 1, wherein the light transmitting material is formed as a convex lens.

5. The method of claim 1, further including a filler material disposed between the light transmitting material and plurality of contact pads.

6. The method of claim 1, further including a clear underfill material disposed between the light transmitting material and optically active area of the optical semiconductor die.

7. The method of claim 2, further including forming a notch in the light transmitting material.

8. A method of making a semiconductor device, comprising:
   providing an optical semiconductor die that generates electrical signals in response to light;
   providing a leadframe having a light transmitting window, a plurality of contact pads formed as fingers around the light transmitting window, and an elevated area vertically offset with respect to the fingers;
   attaching the optical semiconductor die to the leadframe so that the light transmitting window is aligned to an optically active area of the optical semiconductor die; and
   disposing an underfill material between the optical semiconductor die and leadframe such that the underfill material contacts a sidewall of the elevated area.

9. The method of claim 8, wherein the elevated area includes a dam surrounding the light transmitting window.

10. The method of claim 8, further including:
    forming a plurality of vias in the optical semiconductor die; and
    electrically connecting the plurality of vias to the leadframe.

11. The method of claim 8, further including forming a notch in the light transmitting window.

12. The method of claim 8, wherein the light transmitting window is formed as a convex lens.

13. The method of claim 8, wherein the elevated area includes a light transmitting material or an opaque filler material.

14. A method of making a semiconductor package, comprising:
    providing an optical semiconductor die that generates electrical signals in response to light;
    providing a substrate having a plurality of contact pads;
    disposing a light transmitting material between the plurality of contact pads and the substrate, the light transmitting material including an elevated area vertically offset with respect to the substrate; and
    attaching the optical semiconductor die to the substrate so that the light transmitting material is aligned to an optically active area of the optical semiconductor die.

15. The method of claim 14, further including disposing an underfill material between the optical semiconductor die and substrate such that the underfill material contacts a sidewall of the elevated area to prevent the underfill material from blocking a light transmission path through the light transmitting material.

16. The method of claim 14, wherein the substrate is a leadframe or pre-molded laminate substrate.

17. The method of claim 14, wherein the light transmitting material is formed as a convex lens.

18. The method of claim 15, wherein the elevated area is a dam surrounding the light transmission path.

19. A method of making a semiconductor package, comprising:
    providing an optical semiconductor die;
    providing a substrate having a plurality of contact pads;
    disposing a light transmitting material between and substantially coplanar with the plurality of contact pads and the substrate;
    attaching the optical semiconductor die to the substrate so that the light transmitting material is aligned to an optically active area of the optical semiconductor die;
    forming a plurality of vias in the optical semiconductor die; and
    electrically connecting the plurality of vias to the substrate.

20. A semiconductor package, comprising:
    an optical semiconductor die; and
    a substrate having a plurality of contact pads and a light transmitting material disposed between the contact pads such that a portion of the light transmitting material is vertically offset with respect to the contact pads, wherein the optical semiconductor die is attached to the substrate so that the light transmitting material is aligned to an optically active area of the optical semiconductor die.

21. The semiconductor package of claim 20, further including an underfill material disposed between the optical semiconductor die and substrate, the vertically offset portion of the light transmitting material including an elevated area that prevents the underfill material from blocking a light transmission path through the light transmitting material.

22. The semiconductor package of claim 20, further including:
    a plurality of vias formed in the optical semiconductor die; and
    a plurality of bond wires electrically connecting the plurality of vias to the substrate.

23. The semiconductor package of claim 20, wherein the substrate is a leadframe or pre-molded laminate substrate.

24. The semiconductor package of claim 20, further including a notch disposed in the light transmitting material.

25. The semiconductor package of claim 21, wherein the elevated area includes a dam surrounding the light transmitting material.

26. A method of making a semiconductor device, comprising:
    providing an optical semiconductor die that generates electrical signals in response to light;
    providing a leadframe having a plurality of contact pads and an elevated area disposed around a light transmitting window;
    attaching the optical semiconductor die to the plurality of contact pads so that the light transmitting window is aligned to an optically active area of the optical semiconductor die; and
    disposing an underfill material between the optical semiconductor die and leadframe such that the underfill material contacts a sidewall of the elevated area.

27. The method of claim 26, wherein the elevated area includes a light transmitting material or an opaque filler material.

28. The method of claim 26, wherein the elevated area includes a dam surrounding the light transmitting window.

29. The method of claim 26, wherein disposing the underfill material includes disposing a clear underfill material between the light transmitting window and the optical semiconductor die.

30. The method of claim 26, further including forming a notch in the light transmitting window.

31. The method of claim 26, wherein the light transmitting window is formed as a convex lens.

* * * * *